(12) United States Patent
Zhang et al.

(10) Patent No.: US 12,217,927 B2
(45) Date of Patent: Feb. 4, 2025

(54) BEAM MANIPULATION OF ADVANCED CHARGE CONTROLLER MODULE IN A CHARGED PARTICLE SYSTEM

(71) Applicant: ASML NETHERLANDS B.V., Veldhoven (NL)

(72) Inventors: Jian Zhang, San Jose, CA (US); Ning Ye, San Jose, CA (US); Zhiwen Kang, San Jose, CA (US); Yixiang Wang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 441 days.

(21) Appl. No.: 17/633,556

(22) PCT Filed: Aug. 4, 2020

(86) PCT No.: PCT/EP2020/071942
§ 371 (c)(1),
(2) Date: Feb. 7, 2022

(87) PCT Pub. No.: WO2021/023752
PCT Pub. Date: Feb. 11, 2021

(65) Prior Publication Data
US 2022/0351932 A1      Nov. 3, 2022

Related U.S. Application Data

(60) Provisional application No. 62/884,631, filed on Aug. 8, 2019.

(51) Int. Cl.
*H01J 37/26* (2006.01)
*G02B 27/09* (2006.01)
(Continued)

(52) U.S. Cl.
CPC ........ *H01J 37/026* (2013.01); *G02B 27/0966* (2013.01); *H01J 37/28* (2013.01); *H01J 2237/0047* (2013.01)

(58) Field of Classification Search
CPC .. H01J 37/026; H01J 37/28; H01J 2237/0047; H01J 2237/2817; G02B 27/0966
(Continued)

(56) References Cited

U.S. PATENT DOCUMENTS

| | | | |
|---|---|---|---|
| 2002/0063773 A1* | 5/2002 | Riepenhoff | G02B 19/0014 347/258 |
| 2008/0056746 A1* | 3/2008 | Suhara | G01R 31/305 399/56 |
| 2009/0302218 A1* | 12/2009 | Suhara | G03G 15/043 250/310 |

FOREIGN PATENT DOCUMENTS

| | | |
|---|---|---|
| CN | 108646167 A | 10/2018 |
| TW | 201130010 A | 9/2011 |
| TW | 201721701 A | 6/2017 |

OTHER PUBLICATIONS

International Search Report and Written Opinion issued by the International Searching Authority in related foreign Application No. PCT/EP2020/071942, mailed Oct. 20, 2020.

* cited by examiner

*Primary Examiner* — Michael Maskell
(74) *Attorney, Agent, or Firm* — FINNEGAN, HENDERSON, FARABOW, GARRETT & DUNNER, LLP

(57) ABSTRACT

A system and a method for manipulating a beam of an Advanced Charge Controller module in different planes in an e-beam system are provided. Some embodiments of the system include a lens system configured to manipulate a beam in the tangential plane and the sagittal plane such that (Continued)

the beam spot is projected onto the wafer with high luminous energy. Some embodiments of the system include a lens system comprising at least two cylindrical lens.

18 Claims, 9 Drawing Sheets

(51) Int. Cl.
*H01J 37/02* (2006.01)
*H01J 37/28* (2006.01)

(58) Field of Classification Search
USPC .................................. 250/306, 307, 310, 311
See application file for complete search history.

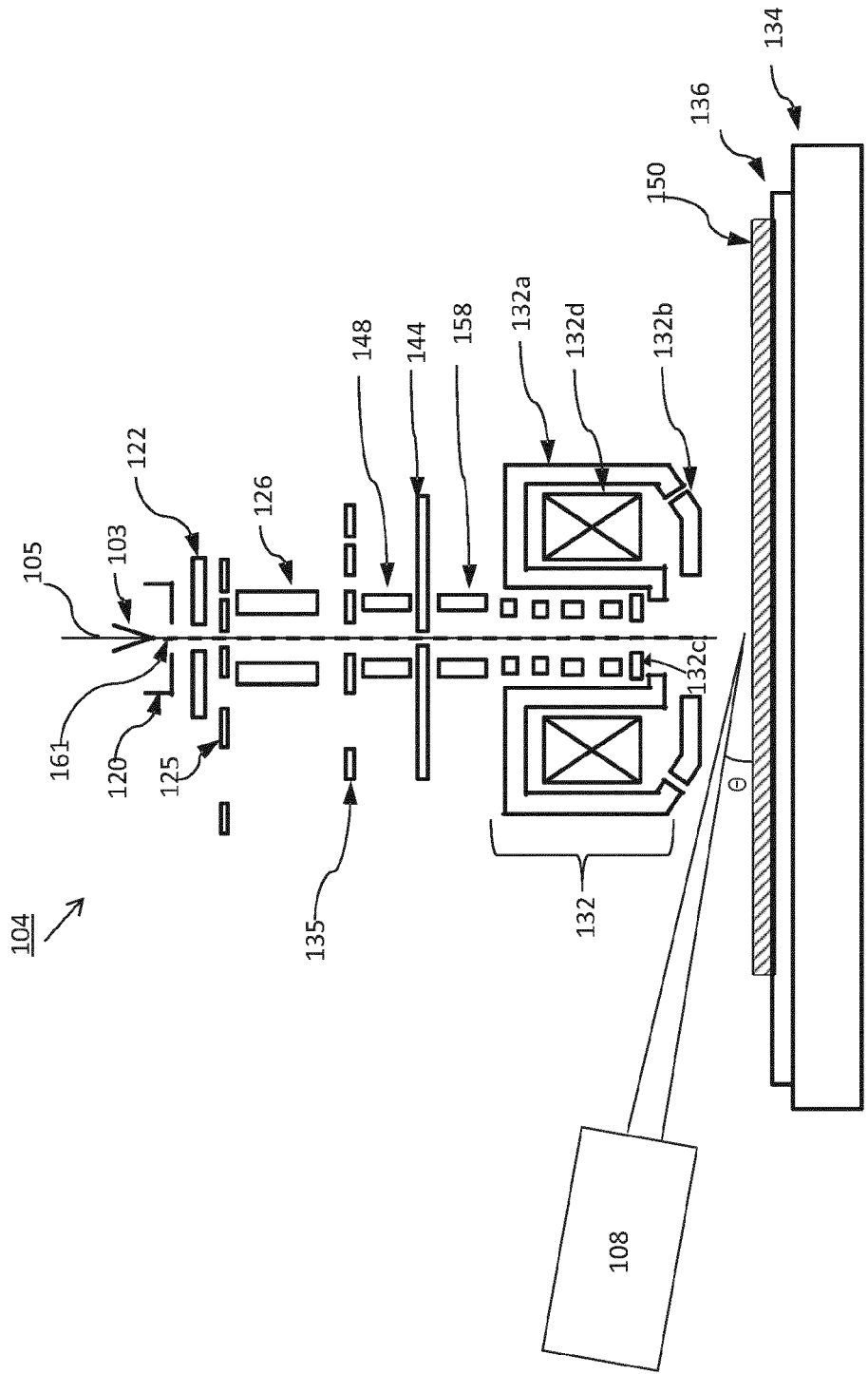

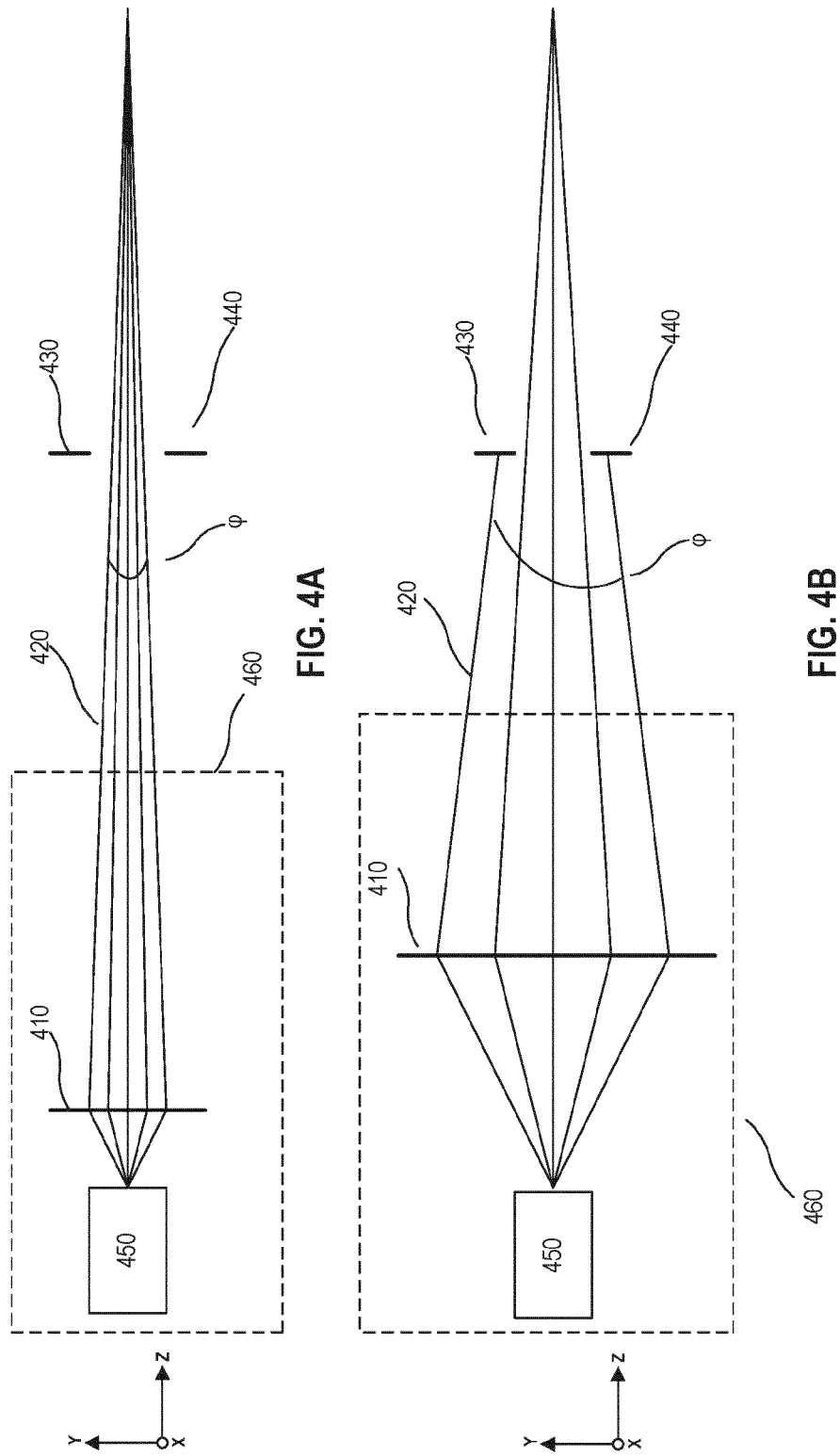

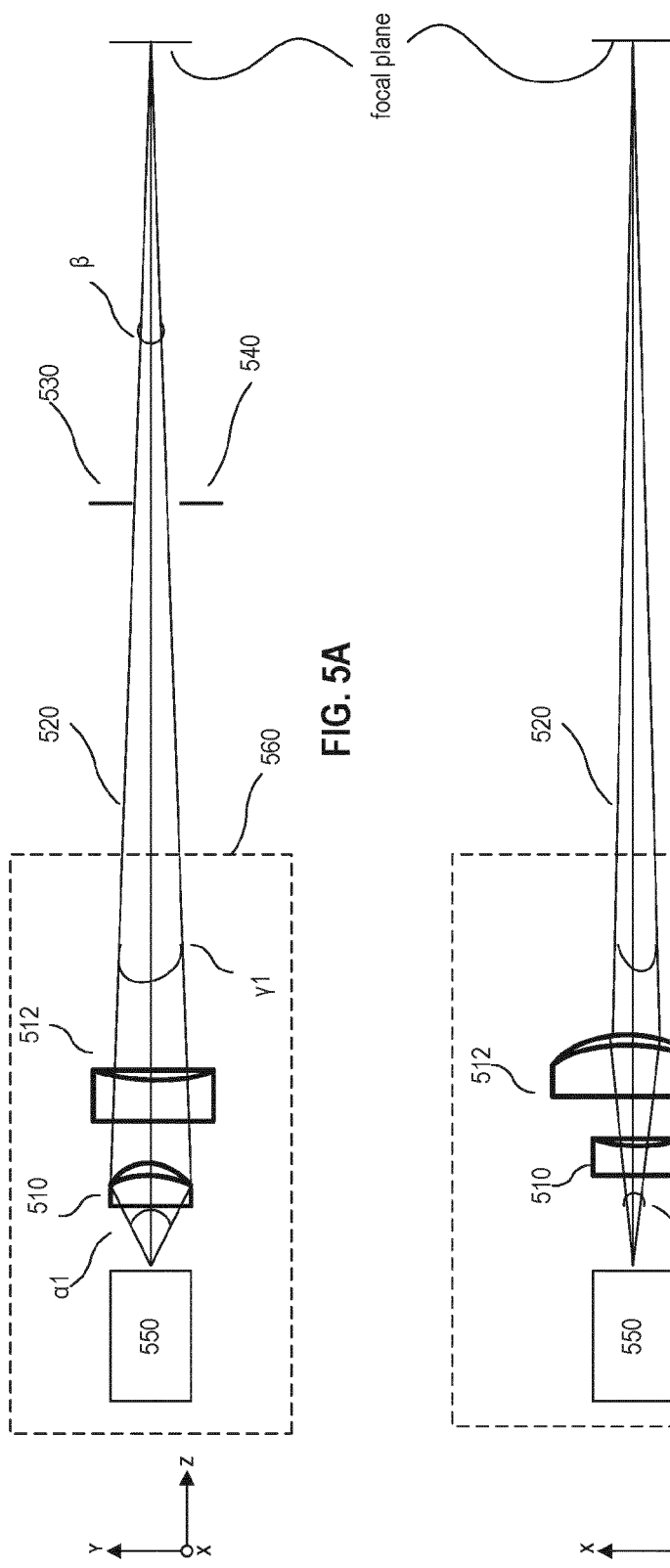

BEAM MANIPULATION OF ADVANCED CHARGE CONTROLLER MODULE IN A CHARGED PARTICLE SYSTEM

CROSS-REFERENCE TO RELATED APPLICATIONS

This application claims priority to International Application No. PCT/EP2020/071942, filed Aug. 4, 2020, and published as WO 2021/023752 A1, which claims priority of U.S. application 62/884,631 which was filed on Aug. 8, 2019. The contents of these applications are incorporated herein by reference in their entireties.

TECHNICAL FIELD

The present disclosure generally relates to the field of providing a beam for controlling charges on a sample surface of charged particle beam system.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments consistent with the present disclosure include systems and methods for manipulating a beam in an electron beam system. The system includes an electron beam tool. The system also includes an Advanced Charge Controller (ACC) module comprising a beam source for emitting a beam and a lens system. The lens system is configured to direct the beam to a specified position on a wafer beneath the electron beam tool and shape a projection spot of the beam on the wafer by manipulating a fan angle of the beam in a tangential plane and a fan angle of the beam in a sagittal plane.

The method includes emitting a beam from a beam source of an ACC module; directing, using a lens system of the ACC, the beam to a specified position on a wafer beneath an electron beam tool; and shaping, using the lens system, a projection spot of the beam on the wafer by manipulating a fan angle of the beam in a tangential plane and a fan angle of the beam in a sagittal plane.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF DRAWINGS

FIG. 2B is a schematic diagram illustrating an exemplary electron beam tool, consistent with embodiments of the present disclosure that may be a part of the exemplary EBI system of FIG. 1.

FIG. 4A and FIG. 4B illustrate configurations of a conventional ACC module.

FIG. 5A is a view in the tangential (Y-Z) plane of an exemplary ACC module configuration consistent with embodiments of the present disclosure.

FIG. 5B is a view in the sagittal (X-Z) plane of an exemplary ACC module configuration consistent with embodiments of the present disclosure.

DETAILED DESCRIPTION

Figure 1:
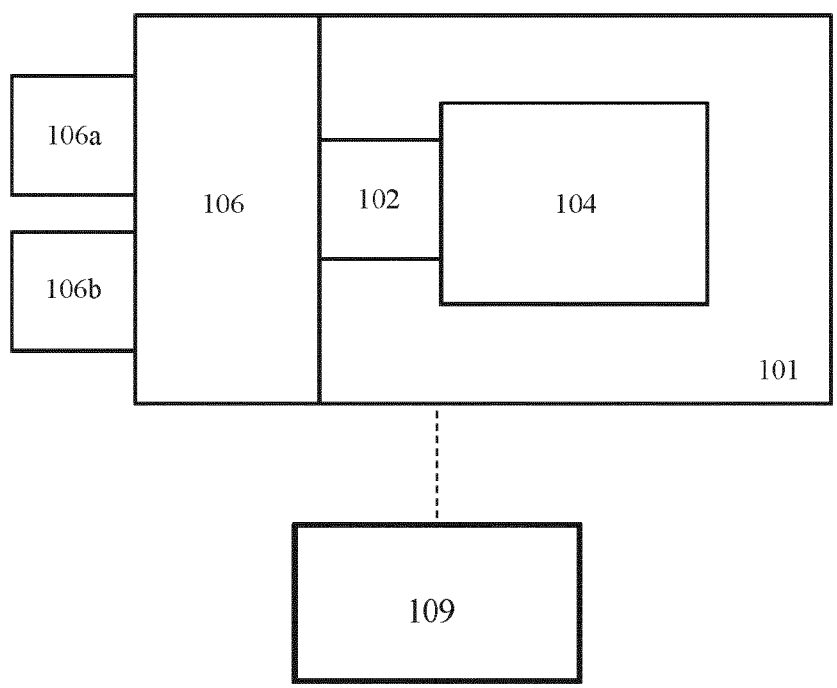
FIG. 1 illustrates an exemplary electron beam inspection (EBI) system 100, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

Defects may be generated during various stages of semiconductor processing. For the reason stated above, it is important to find defects accurately and efficiently as early as possible. A charged particle (e.g., electron) beam microscope, such as a scanning electron microscope (SEM), is a useful tool for inspecting semiconductor wafer surfaces to detect defects. During operation, the charged particle beam microscope scans a primary charged-particle beam, such as an electron beam (e-beam), over a semiconductor wafer held on a wafer holder, and generates an image of the wafer surface by detecting a secondary charged-particle beam reflected from the wafer surface. When the charged-particle beam scans the wafer, charges may be accumulated on the wafer due to large beam current, which may affect the quality of the image. To regulate the accumulated charges on the wafer, an Advanced Charge Controller (ACC) module is employed to illuminate a light beam, such as a laser beam, on the wafer, so as to control the accumulated charges due to effects such as photoconductivity, photoelectric, or thermal effects. It is thus important to improve the performance of the ACC module so as to effectively control the accumulated charges.

ACC modules, however, suffer from the constraints of the SEM. For example, the beam from the ACC module is usually projected onto the wafer at a small angle due to the small working distance and limited space between the electron beam (e-beam) column components and the wafer holder that holds the semiconductor wafer. Because of the small angle, the substantially circular cross-section of the beam from the ACC module is projected onto the wafer with a substantially oval-shaped cross-section and due to the limited space between the e-beam column components and the wafer holder, the amount of the beam landing on the targeted pixel of the wafer is reduced. This reduced amount of the beam landing on the wafer results in reduced efficiency of the ACC module. Because of the small angle, the shape of the beam emitted from the ACC module may be manipulated to fit in the small space between the e-beam column components and the wafer holder (e.g., the space between components 132 and wafer 150 of FIG. 2B).

Due to the limited spacing, conventional ACC modules suffer from several trade-offs. For example, conventional ACC modules can use a lens with a small working distance (e.g. distance between beam source 450 and lens 410 illustrated in FIG. 4A), which can enable more luminous energy to project onto a wafer but with a higher magnification. While the higher magnification can lead to a larger beam size on the wafer, it can also lead to less charge density on the wafer. As another example, conventional ACC modules can use a lens with a larger working distance (e.g. distance between beam source 450 and lens 410 illustrated in FIG. 4B), but this design has its own issues. While a lower magnification can be achieved resulting in a higher charge density on the wafer, less luminous energy reaches the wafer as part of the beam is blocked by the SEM components (see, e.g., FIG. 4B where 430 and 440 block part of the beam).

The disclosed embodiments provide an ACC module that includes a lens system that addresses some or all of these disadvantages. The disclosed embodiments provide an ACC module having a lens system that not only shapes the beam to avoid the SEM components, but also provides, on the wafer, an illuminated area having sufficient charge density.

In some instances, the disclosed system can emit multiple beams from the ACC module at an angle without using any lenses to project a beam with the desired beam spot shape and luminous energy onto the wafer. In other instances, the lens system can include one lens or more than two lenses.

FIG. 1 illustrates an exemplary electron beam inspection (EBI) system 100 consistent with embodiments of the present disclosure. While this and other examples refer to an electron beam system, it is appreciated that the techniques disclosed herein are applicable to systems other than electron beam systems, such as an ellipsometer, a velocimeter, a CO2 laser (e.g., for machining), non-electron beam systems where a beam projection spot may be optimized but the space is limited, among others. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 2A:
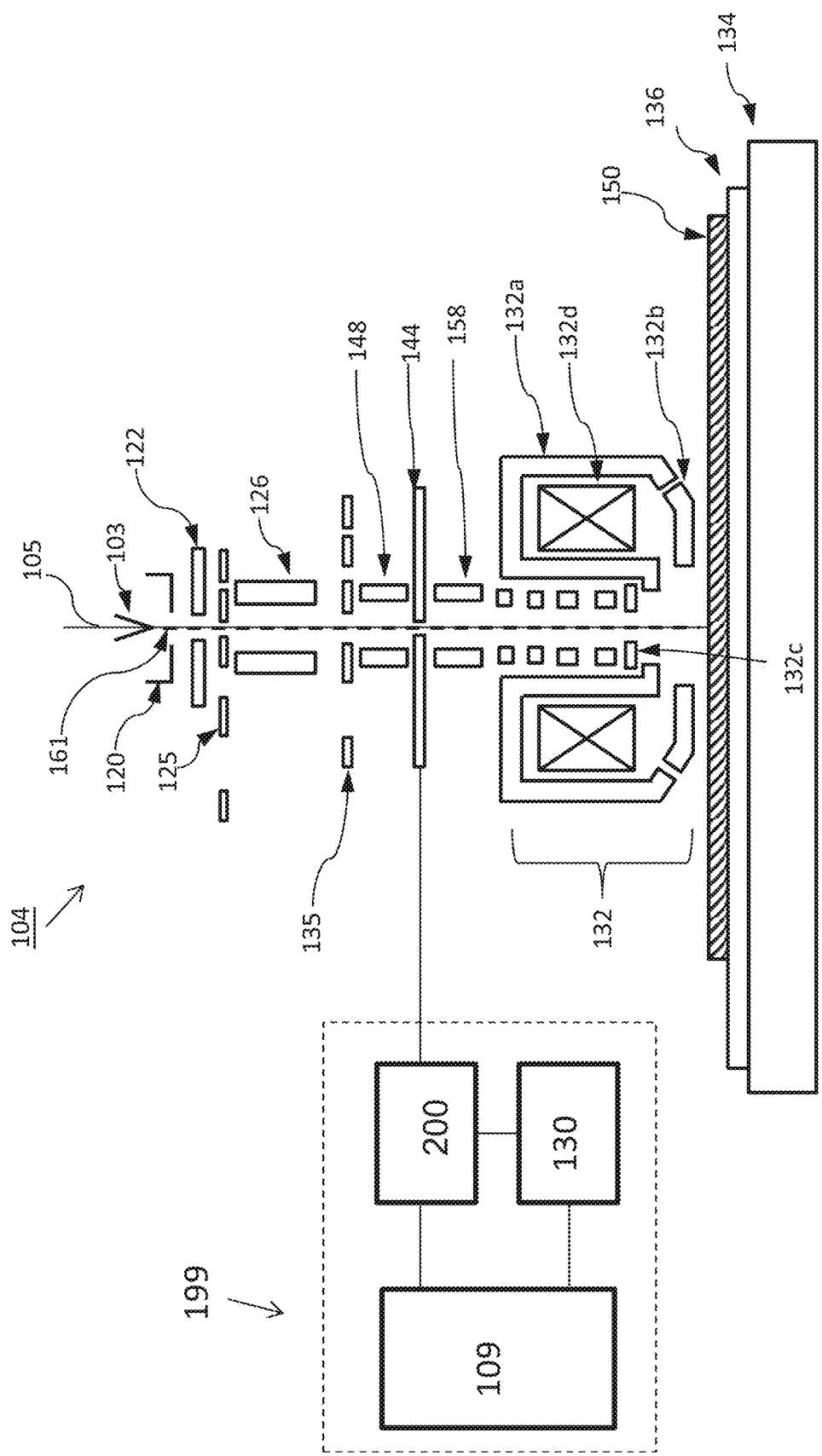
FIG. 2A is a schematic diagram illustrating an exemplary electron beam tool, consistent with embodiments of the present disclosure that may be a part of the exemplary EBI system of FIG. 1.

FIG. 2A illustrates a charged particle beam apparatus in which an electron beam system may comprise a single primary beam that may be configured to generate a secondary beam. A detector may be placed along an optical axis 105, as shown in FIG. 2A. In some embodiments, a detector may be arranged off axis.

As shown in FIG. 2A, an electron beam tool 104 may include a wafer holder 136 supported by motorized stage 134 to hold a wafer 150 to be inspected. Electron beam tool 104 includes an electron beam source, which may comprise a cathode 103, an anode 120, and a gun aperture 122. Electron beam tool 104 further includes a beam limit aperture 125, a condenser lens 126, a column aperture 135, an objective lens assembly 132, and an electron detector 144. Objective lens assembly 132, in some embodiments, may be a modified swing objective retarding immersion lens (SORIL), which includes a pole piece 132a, a control electrode 132b, a deflector 132c, and an exciting coil 132d. In an imaging process, an electron beam 161 emanating from the tip of cathode 103 may be accelerated by anode 120 voltage, pass through gun aperture 122, beam limit aperture 125, condenser lens 126, and focused into a probe spot by the modified SORIL lens and then impinge onto the surface of wafer 150. The probe spot may be scanned across the surface of wafer 150 by a deflector, such as deflector 132c or other deflectors in the SORIL lens. Secondary electrons emanated from the wafer surface may be collected by detector 144 to form an image of an area of interest on wafer 150.

There may also be provided an image processing system 199 that includes an image acquirer 200, a storage 130, and controller 109. Image acquirer 200 may comprise one or more processors. For example, image acquirer 200 may comprise a computer, server, mainframe host, terminals, personal computer, any kind of mobile computing devices, and the like, or a combination thereof. Image acquirer 200 may connect with detector 144 of electron beam tool 104 through a medium such as an electrical conductor, optical fiber cable, portable storage media, IR, Bluetooth, internet, wireless network, wireless radio, or a combination thereof. Image acquirer 200 may receive a signal from detector 144 and may construct an image. Image acquirer 200 may thus acquire images of wafer 150. Image acquirer 200 may also perform various post-processing functions, such as generating contours, superimposing indicators on an acquired image, and the like. Image acquirer 200 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 200 and may be used for saving scanned raw image data as original images, and post-processed images. Image acquirer 200 and storage 130 may be connected to controller 109. In some embodiments, image acquirer 200, storage 130, and controller 109 may be integrated together as one control unit.

In some embodiments, image acquirer 200 may acquire one or more images of a sample based on an imaging signal received from detector 144. An imaging signal may correspond to a scanning operation for conducting charged particle imaging. An acquired image may be a single image comprising a plurality of imaging areas that may contain various features of wafer 150. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 2A, the electron beam tool 104 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape.

Although FIG. 2A shows electron beam tool 104 as a single-beam inspection tool that may use only one primary electron beam to scan one location of wafer 150 at a time, embodiments of the present disclosure are not so limited. For example, electron beam tool 104 may also be a multi-beam inspection tool that employs multiple primary electron beamlets to simultaneously scan multiple locations on wafer 150.

FIG. 2B illustrates a charged particle beam apparatus with an ACC module 108 for directing an illumination beam to a spot on a wafer during inspection consistent with embodiments of the present disclosure. The components of FIG. 2B are similar to those of FIG. 2A, except that FIG. 2B provides ACC module 108.

As stated above, ACC module 108 projects a beam onto wafer 150 for controlling a charge on the wafer surface of the charged particle beam tool. Due to the limited space beneath charged particle beam tool 104, however, ACC module 108 may project a beam at an angle θ of less than 45°, but usually less than 30° in order to project the beam through the small space between the objective lens assembly 132 of electron beam tool 104 and wafer 150. In some embodiments, electron beam tool 104 can generate multiple primary electron beamlets to simultaneously scan multiple locations on wafer 150. In some embodiments, the beam projected by ACC module 108 can charge a location on wafer 150 large enough so that multiple primary electron beamlets can scan corresponding portions on wafer 150. In some embodiments, electron beam tool 104 can include a plurality of ACC modules 108 to project a beam onto wafer 150 for each primary electron beamlet, a plurality of the primary electron beamlets, or any combination thereof.

Figure 3A:
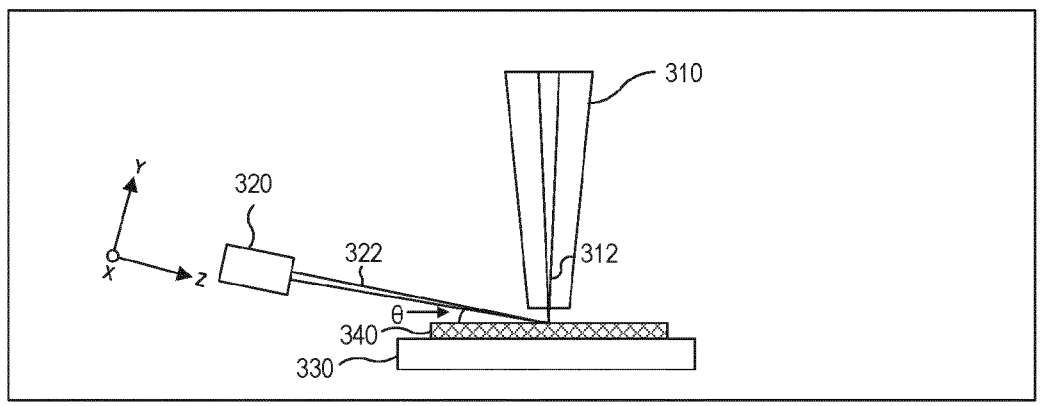
FIG. 3A is a side view of an electron beam system, consistent with embodiments of the present disclosure.

FIG. 3A is a side view of an electron beam system 300 consistent with embodiments of the present disclosure. As shown in FIG. 3A, electron beam system 300 includes an electron beam tool 310, an ACC module 320, and a wafer holder 330 on which a sample to be inspected (e.g., a wafer 340) is disposed. Electron beam tool 310 may emit a primary electron beam 312 onto an area of interest on wafer 340, and collect secondary electrons emanated from the wafer surface to form an image of the area of interest on wafer 340. ACC module 320, positioned at a small angle θ, may include an ACC beam source that emits a light beam 322 (e.g., laser beam) onto wafer 340 and form a beam spot of light beam 322 on the wafer surface. When primary electron beam 312 irradiates the area of interest on wafer 340, charges may be accumulated due to a large electron beam current. Light beam 322 emitted from ACC module 320 may be configured to regulate the accumulated charges due to photoconductivity or photoelectric effect, or a combination of photoconductivity and photoelectric effect, among others. ACC module 320 may be positioned at angle θ, usually less than 30°, in order to project light beam 322 onto wafer 340 without landing on the column components of electron beam tool 310.

Figure 3B:
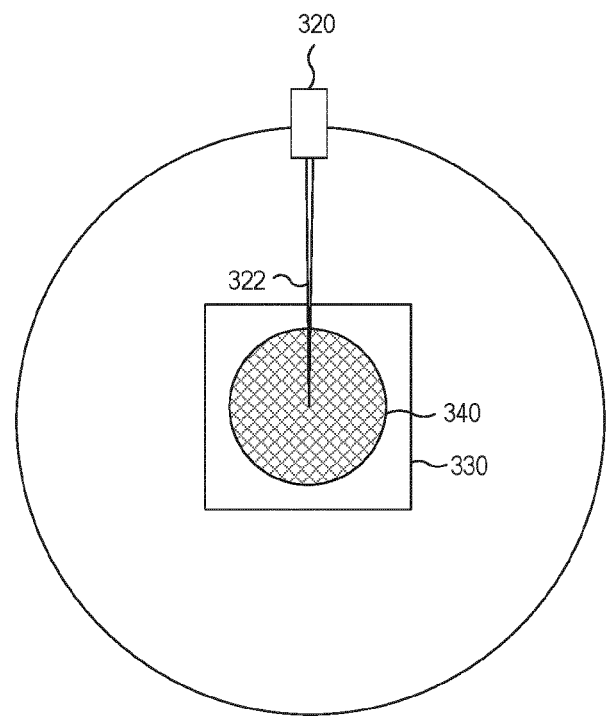
FIG. 3B is a top view of the electron beam system of FIG. 3A, consistent with embodiments of the present disclosure.

FIG. 3B is a top view of electron beam system 300 during operation of wafer inspection, consistent with embodiments of the present disclosure. To simplify the illustration, electron beam tool 310 is omitted from FIG. 3B. As shown in FIG. 3B, in electron beam system 300, light beam 322 from ACC module 320 may be aligned with the field of view (FOV) of electron beam tool 310. In some embodiments, a special designed sample surface may be used to collect the light beam signal emitted from ACC module 320. In yet other embodiments, the wafer surface or a smooth surface may also be used to collect the light beam signal emitted from ACC module 320.

In some embodiments, such as the embodiment illustrated in FIG. 3A, ACC module 320 is disposed outside of a vacuum chamber, in which electron beam tool 310 and wafer 340 are disposed. During operation of the electron beam system 300, light beam 322 may pass through one or more windows formed in the vacuum chamber. In some alternative embodiments, ACC module 320 may be disposed inside of the vacuum chamber.

Figure 3C:
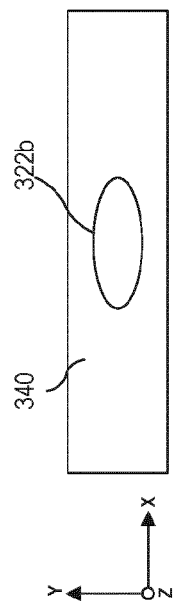
FIG. 3C is a top/side view of a beam emitted from an ACC module consistent with embodiments of the present disclosure.
Figure 3D:
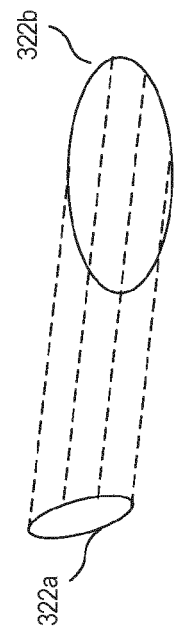
FIG. 3D is a view in the Y-X plane of a beam emitted from an ACC module consistent with embodiments of the present disclosure.
Figure 3E:
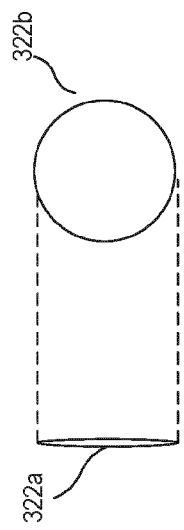
FIG. 3E is a top view of a beam emitted from an ACC module consistent with embodiments of the present disclosure.

FIGS. 3C-3E show various views of the beam emitted from ACC module 320, consistent with some embodiments of the present disclosure. For example, FIG. 3C is a top/side view, FIG. 3D is a view in the Y-X plane relative to ACC module 320, and FIG. 3E is a top view of the beam emitted from an ACC module and projected onto wafer. To improve performance of ACC module 320 given the small working distance and limited space between e-beam column components 310 and wafer holder 330, ACC module 320 provides a high power density beam 322 on the wafer 340, the area of the beam projected onto the semiconductor wafer (hereinafter "illuminated area") 322b may be larger than the field of view (FOV) or pixel of the e-beam system with the power distribution of the beam being uniform in the FOV or pixel. That is, illuminated area 322b can have a substantially round shape with a size that is slightly larger than the size of the FOV or pixel of the e-beam system. The shape of illuminated area 322b may be substantially circular when emitted beam 322a is ellipse-shaped to cause circular illumination, or may be ellipse-shaped when emitted beam 322a is circular-shaped.

Typically, beam 322 from ACC module 320 is projected onto wafer 340 at an angle θ of less than 30° due to the small working distance and limited space between e-beam column components 310 and wafer holder 330. Because of the small angle θ, the shape of the beam emitted from the ACC module (hereinafter "emitted beam") 322a is different from the shape of illuminated area 322b. Emitted beam 322a may be ellipse-shaped, as illustrated in FIG. 3C, and illuminated area 322b may be round-shaped on the semiconductor wafer 340, as illustrated in FIG. 3E, due to small angle θ. Additionally, because the space between the e-beam column components and the wafer holder is limited in the direction perpendicular to the surface of the wafer holder, the space may limit the angle of a light cone that can pass through the space, such as to a light cone angle of less than 20°.

FIG. 4A and FIG. 4B are views in the tangential (Y-Z) plane of conventional configurations of an ACC module 460. In order to provide a high density beam on the wafer, the beam source 450 may have high luminous exitance and most of the light can be collected and projected onto the wafer with a small projection size. Providing more luminous energy to the wafer may be facilitated by using a lens with high magnification so that the emitted beam has a light cone angle small enough to pass through the limited space between the e-beam column components and the wafer holder. For example, with respect to FIG. 4A, in order to provide more luminous energy to the wafer, high magnification of lens 410 may be facilitated by positioning lens 410 closer to the beam source 450. High magnification of lens 410 may be desired to project a beam 420 with a light cone angle φ sufficiently small enough to pass through the space between the e-beam column components 430 and the wafer holder 440. However, the high magnification results in a larger beam size. Projecting a beam size that is too large is undesirable since illuminated area size is inversely related to luminance. Thus, an illuminated area size that is too large results in a reduced amount of luminous energy provided to the wafer. A reduction of luminous energy provided on the wafer can be problematic in terms of achieving higher throughput, as higher amounts of luminous energy provided to the wafer increase power density and, thus, achieve higher processing speeds during operation of wafer inspection.

In conventional systems, reducing the beam size requires lower magnification. In the configuration of FIG. 4B, low magnification of lens 410 is achieved by positioning lens 410 closer to beam source 450. Low magnification of lens 410 can provide a beam 420 with a smaller beam size. However, low magnification of lens 410 provides a beam with a larger light cone angle φ. Because of the larger light cone angle φ, some of beam 420 is blocked by the e-beam column components 430 and wafer holder 440. This configuration also results in a reduced amount of luminous energy provided to the wafer since at least some of beam 420 does not reach the wafer.

Due to the small working distance and limited space between the e-beam column components and the wafer holder that holds the wafer, some conventional ACC modules may not have a lens system that can project a beam with a sufficiently small illuminated area size or sufficiently high luminous energy onto the wafer. In order to solve this problem, the disclosed systems can configure the lens system of the ACC module to shape the illuminated area by manipulating a fan angle of the beam in a tangential plane and a fan angle of the beam in a sagittal plane. This method of shaping the projection spot of the beam on the wafer is one method of facilitating the desired cross-section shape of the illumination area on the wafer. A person of ordinary skill in the art would recognize that additional methods of facilitating the desired cross-section shape of the illumination area on the wafer exist.

FIG. 5A is a view in the tangential (Y-Z) plane of an exemplary ACC module configuration consistent with embodiments of the present disclosure. The ACC module 560 may be part of an EBI system, such as EBI 100 illustrated in FIG. 1 and the EBI system illustrated in FIG. 2C. In the tangential (Y-Z) plane as shown in FIG. 5A, the emitted beam is provided by the beam source 550 and collected by a first lens 510 at a small distance due to its large divergence angle α1. The fan angle γ1 of beam 520 is manipulated by first lens 510 in order to project beam 520 through the limited space between the e-beam column components 530 and the wafer holder 540. First lens 510 may be a cylindrical lens configured to manipulate beam 520 such that beam 520 has a light cone angle β sufficiently small enough to completely pass through the space between e-beam column components 530 and wafer holder 540. As a result, a large magnification can be obtained and, therefore, beam 520 with sufficiently small light cone angle β can pass through the space between e-beam column components 530 and wafer holder 540.

FIG. 5B is a view in the sagittal (X-Z) plane of the exemplary ACC module configuration illustrated in FIG. 5A. As shown in FIG. 5B, the emitted beam is collected by a second lens 512 at a large distance due to its small divergence angle α2, where α2 is less than α1. Second lens 512 manipulates the fan angle γ2 of beam 520 in order to project beam 520 with a sufficiently small beam size. Second lens 512 may also be a cylindrical lens. While a spherical lens may be used in some embodiments, it may not be used in others because its rotational symmetry causes the cross-section of beam 520 to maintain the same elliptical shape after passing through the lens, which disadvantageously may not allow beam 520 to pass through the space between e-beam column components 530 and wafer holder 540. In some embodiments, a combination of rotationally asymmetric lenses (e.g., cylindrical lenses) may be used because the rotational asymmetry of each lens advantageously allows the cross-section of beam 520 to be manipulated in separate planes. The combination of first lens 510 and second lens 512 results in providing a beam with higher luminous energy to the wafer such that a higher power density is provided to the wafer and thus, higher processing speeds are achieved during operation of wafer inspection. As a result, a lower magnification can be obtained and, therefore, a beam with a sufficiently high beam density and luminous energy can reach the wafer. Therefore, ACC module 560 can project a beam that bypasses e-beam column components 530 and wafer holder 540 without impact and appropriately charges the wafer with the desired luminous energy.

ACC module 560 is not limited to a single configuration. That is, the number of lenses used and the positioning of those lenses within ACC module 560 can vary. Additionally, first lens 510 and second lens 512 are not limited to cylindrical lens and can comprise lenses of various shapes and dimensions, including different curvatures. For example, in one configuration of the ACC module, the distance between beam source 550 and first lens 510 may be 6.775 mm, the thickness of first lens 510 may be 2.500 mm, the distance between first lens 510 and second lens 512 may be 11.90 mm, the thickness of second lens 512 may be 4.000 mm, and the distance between second lens 512 and e-beam column components 530 may be 109.8 mm.

Figure 6A:
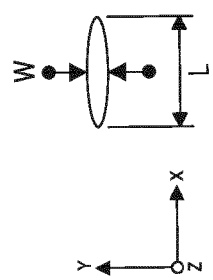
FIG. 6A illustrates a cross-section of the beam emitted from the ACC module consistent with embodiments of the present disclosure.
Figure 6B:
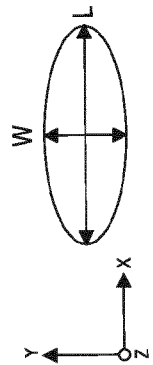
FIG. 6B illustrates a cross-section of the beam emitted from the ACC module after passing through the lens system of the ACC module consistent with embodiments of the present disclosure.
Figure 6C:
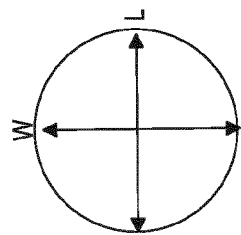
FIG. 6C illustrates a cross-section of the beam emitted from the ACC module as projected on the wafer consistent with embodiments of the present disclosure.

FIG. 6A, FIG. 6B, and FIG. 6C are views of a cross-section of a beam emitted from the beam source of and within an ACC module consistent with embodiments of the present disclosure (e.g., ACC module in FIG. 2B, FIG. 3A, and FIGS. 5A-5B). FIG. 6A illustrates a cross-section of the emitted beam after it leaves beam source 550 of ACC module 560 shown in FIGS. 5A-5B (e.g., emitted beam 322a in FIG. 3C, FIG. 3D, and FIG. 3E) while FIG. 6B illustrates a cross-section of the same emitted beam after it leaves second lens 512 of ACC module 560 shown in FIGS. 5A-5B. As shown in FIG. 6A and FIG. 6B, the cross-section of the emitted beam is ellipse-shaped before and after it passes through the lens system. FIG. 6C illustrates a cross-section of the same beam as it is projected on the wafer within the space between e-beam column components 530 and wafer holder 540 of FIGS. 5A-5B (e.g., illuminated area 322b in FIG. 3C, FIG. 3D, and FIG. 3E). The dimensions of the cross sections of the beam may vary with the different configurations within the ACC module. For example, in one ACC module consistent with embodiments of the present disclosure, the length L of the emitted beam in FIG. 6A may be 8 micrometers while the width W of the same emitted beam may be 2 micrometers. In the same configuration, the length L of the same beam in FIG. 6B after passing the lens system may be 56 micrometers while the width may be 25 micrometers. In the same configuration, the length L of the same beam in FIG. 6C projected onto the wafer may be 56 micrometers while the width W may be 50 micrometers. However, the illuminated area in FIG. 6C may have a diameter of approximately 50 to 300 micrometers.

Figure 7:
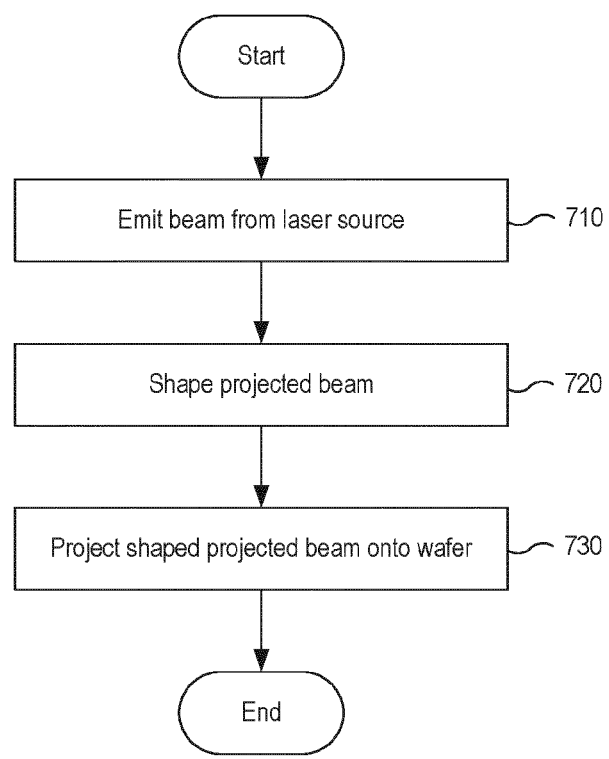
FIG. 7 is an exemplary flowchart of a process for manipulating a beam in an electron beam system, consistent with embodiments of the present disclosure.

FIG. 7 is an exemplary flowchart of a process 700 for manipulating a beam in an electron beam system by using a lens system, consistent with embodiments of the present disclosure. Process 700 may be performed by an ACC module, such as ACC module 108 in illustrated in FIG. 2B. As shown in FIG. 7, at step 710, the ACC module comprising a beam source (e.g., beam source 550 of FIGS. 5A-5B) may emit a beam having an ellipse shape (e.g., emitted beam 322a in FIG. 3C and FIG. 3E; FIG. 6A). The beam is emitted having a first divergence angle in the tangential plane (e.g., $\alpha 1$ in FIG. 5A) and a second divergence angle in the sagittal plane (e.g., $\alpha 2$ in FIG. 5B). At step 720, the emitted beam passes through the lens system, where the cross-section of the emitted beam is shaped into a different ellipse shape (e.g., ellipse shape of FIG. 6B) by the lens system (e.g., first lens 510 and second lens 512 in FIG. 5A and FIG. 5B). For example, the emitted beam is collected by a first lens, which manipulates the fan angle in the tangential plane of the beam leaving the first lens so that the light cone angle of the emitted beam is small enough to pass completely through the space between the e-column components and the wafer holder. The emitted beam may then be collected by a second lens, which manipulates the fan angle in the sagittal plane of the beam leaving the second lens so that the size of the illuminated area size is sufficiently small enough to provide higher luminous energy to the wafer.

At step 730, the ACC module projects the beam onto the wafer so that the illuminated area is substantially round. The substantially round shape of the illuminated area increases the area of the wafer that is irradiated by the beam, which consequently increases the area of the wafer that is provided with higher luminous energy and appropriately charged.

Although the cross-section shape of the emitted beam described is an ellipse, the cross-section shape of the emitted beam may be any shape that facilitates the desired cross-section shape of the illuminated area on the wafer.

The embodiments may further be described using the following clauses:

1. An electron beam system, the system comprising:
    an electron beam tool; and
    an advanced charge controller (ACC) module comprising:
    a laser source configured to emit a beam, and
    a lens system configured to shape the emitted beam by manipulating a fan angle of the emitted beam in a tangential plane and a fan angle of the beam in a sagittal plane for illuminating an area on a wafer beneath the electron beam tool.
2. The system of clause 1, wherein the beam may comprise a plurality of beams.
3. The system of clause 1, wherein the lens system is positioned at an angle of 30 degrees or less with respect to the wafer.
4. The system of clause 1, wherein the lens system is configured to project the beam such that a light cone angle of the beam is less than 20 degrees.
5. The system of clause 1, wherein the lens system comprises a first lens and a second lens.
6. The system of clause 5, wherein the first lens is configured to manipulate the fan angle of the emitted beam in the tangential plane and the second lens is configured to manipulate the fan angle of the emitted beam in the sagittal plane.
7. The system of clause 6, wherein a distance between the first lens and the laser source is shorter than a distance between the second lens and the laser source.
8. The system of clause 7, wherein at least one of the first lens or the second lens has a cylindrical shape.

9. The system of clause 1, wherein the illuminated area of the wafer is substantially circular when viewed from above the wafer.

10. The system of clause 1, wherein a divergence angle in the tangential plane is equal to or different from a divergence angle in the sagittal plane.

11. A method for manipulating a beam in an electron beam system, the method comprising:
emitting a beam from a laser source of an advanced charge controller (ACC) module; and
shaping, using a lens system, the emitted beam by manipulating a fan angle of the emitted beam in a tangential plane independently from manipulating a fan angle of the emitted beam in a sagittal plane for illuminating an area on a wafer.

12. The method of clause 11, wherein the beam may comprise a plurality of beams.

13. The method of clause 11, further comprising projecting the beam such that a light cone angle of the beam is less than 20 degrees.

14. The method of clause 11, wherein the lens system comprises a first lens and a second lens.

15. The method of clause 14 further comprising the first lens manipulating the fan angle of the emitted beam in the tangential plane and the second lens manipulating the fan angle of the emitted beam in the sagittal plane.

16. The method of clause 15, wherein a distance between the first lens and the laser source is shorter than a distance between the second lens and the laser source.

17. The method of clause 16, wherein at least one of the first lens or the second lens each has a cylindrical shape.

18. The method of clause 11, wherein the illuminated area of the wafer is substantially circular when viewed from above the wafer.

19. The method of clause 11, wherein a divergence angle in the tangential plane is equal to or different from a divergence angle in the sagittal plane.

20. An advanced charge controller (ACC) module comprising:
a laser source configured to emit a beam for illuminating an area on a wafer; and
a lens system configured to shape the emitted beam to have a substantially elliptical cross-section to cause the area of the wafer illuminated by the emitted beam to have a substantially circular cross-section.

21. The ACC module of clause 20, wherein the beam comprises a plurality of beams.

22. The ACC module of clause 20, wherein the lens system is positioned at an angle of 30 degrees or less with respect to a surface of the wafer.

23. The ACC module of clause 20, wherein the lens system is configured to project the beam such that a light cone angle of the beam is less than 20 degrees.

24. The ACC module of clause 20, wherein the lens system comprises a first lens and a second lens.

25. The ACC module of clause 24, wherein the first lens is configured to manipulate a fan angle of the emitted beam in a tangential plane and the second lens is configured to manipulate a fan angle of the emitted beam in a sagittal plane.

26. The ACC module of clause 25, wherein a distance between the first lens and the laser source is shorter than a distance between the second lens and the laser source.

27. The ACC module of clause 26, wherein at least one of the first lens or the second lens has a cylindrical shape.

28. The ACC module of clause 25, wherein a divergence angle in the tangential plane is equal to or different from a divergence angle in the sagittal plane.

29. A method comprising:
emitting a laser beam with a cross-section comprising curved sides at an angle less than a predetermined angle with reference to a surface of a wafer;
modifying, using a lens system, the laser beam such that the cross-section of the laser beam is a different shape with curved sides; and
illuminating the surface of the wafer with the modified laser beam to form an exposed area that has a substantially circular cross-section.

30. An advanced charge controller (ACC) module comprising:
a laser source configured to emit a beam for illuminating an area on a wafer; and
a lens system configured to shape the emitted beam to cause the area of the wafer illuminated by the emitted beam to have a substantially circular cross-section, wherein the lens system is positioned at an angle less than 45 degrees with respect to the wafer.

31. The ACC module of clause 30, wherein the lens system is configured to shape the emitted beam to have a substantially elliptical cross-section.

32. The ACC module of clause 30, wherein the lens system is positioned at an angle of 30 degrees or less with respect to the wafer.

33. The ACC module of clause 30, wherein the lens system is configured to project the beam such that a light cone angle of the beam is less than 20 degrees.

A non-transitory computer readable medium may be provided that stores instructions for a processor of a controller (e.g., controller 109 of FIG. 1) for controlling the ACC module, consistent with embodiments in the present disclosure, based on the beam profile and beam power of the light beam. For example, based on the beam power of light beam, the controller may automatically adjust a working current of the ACC beam source included in the ACC module to keep an output power of the ACC beam source at a target power or to remain stable. Moreover, based on the beam power of the light beam, the controller may be configured to monitor a location of the beam spot formed by the light beam on the wafer surface. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. An electron beam system, the system comprising:
   an electron beam tool; and
   an advanced charge controller (ACC) module comprising:
   a laser source configured to emit a beam, and
   a lens system configured to shape the emitted beam by manipulating a fan angle of the emitted beam in a tangential plane and a fan angle of the beam in a sagittal plane for illuminating an area on a wafer beneath the electron beam tool.

2. The system of claim 1, wherein the beam may comprise a plurality of beams.

3. The system of claim 1, wherein the lens system is positioned at an angle of 30 degrees or less with respect to the wafer.

4. The system of claim 1, wherein the lens system is configured to project the beam such that a light cone angle of the beam is less than 20 degrees.

5. The system of claim 1, wherein the lens system comprises a first lens and a second lens.

6. The system of claim 5, wherein the first lens is configured to manipulate the fan angle of the emitted beam in the tangential plane and the second lens is configured to manipulate the fan angle of the emitted beam in the sagittal plane.

7. The system of claim 6, wherein a distance between the first lens and the laser source is shorter than a distance between the second lens and the laser source.

8. The system of claim 7, wherein at least one of the first lens or the second lens has a cylindrical shape.

9. The system of claim 1, wherein the illuminated area of the wafer is substantially circular when viewed from above the wafer.

10. The system of claim 1, wherein a divergence angle in the tangential plane is equal to a divergence angle in the sagittal plane.

11. A method for manipulating a beam in an electron beam system, the method comprising:
    emitting a beam from a laser source of an advanced charge controller (ACC) module; and
    shaping, using a lens system, the emitted beam by manipulating a fan angle of the emitted beam in a tangential plane independently from manipulating a fan angle of the emitted beam in a sagittal plane for illuminating an area on a wafer.

12. The method of claim 11, wherein the beam may comprise a plurality of beams.

13. The method of claim 11, further comprising projecting the beam such that a light cone angle of the beam is less than 20 degrees.

14. The method of claim 11, wherein the lens system comprises a first lens and a second lens.

15. The method of claim 14 further comprising the first lens manipulating the fan angle of the emitted beam in the tangential plane and the second lens manipulating the fan angle of the emitted beam in the sagittal plane.

16. The system of claim 1, wherein a divergence angle in the tangential plane is different from a divergence angle in the sagittal plane.

17. The system of claim 1, wherein the lens system is configured to manipulate the emitted beam into a first shape by manipulating the fan angle of the emitted beam in the tangential plane and manipulate the emitted beam from the first shape into a second shape by manipulating the fan angle of the beam in the sagittal plane, wherein the illuminated area has a third shape when viewed from above the wafer.

18. The method of claim 11, further comprising manipulating, using the lens system, the emitted beam into a first shape by manipulating the fan angle of the emitted beam in the tangential plane independently from manipulating the emitted beam from the first shape into a second shape by manipulating the fan angle of the emitted beam in the sagittal plane, wherein the illuminated area has a third shape when viewed from above the wafer.

* * * * *